US006606000B2

(12) United States Patent
Mikami et al.

(10) Patent No.: US 6,606,000 B2
(45) Date of Patent: Aug. 12, 2003

(54) RADIO-FREQUENCY AMPLIFIER, RADIO-FREQUENCY MODULE AND COMMUNICATION DEVICE

(75) Inventors: Shigeyuki Mikami, Yokohama (JP); Takatoshi Kato, Mino (JP); Hiroyasu Matsuzaki, Yokohama (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 6 days.

(21) Appl. No.: 10/096,885

(22) Filed: Mar. 13, 2002

(65) Prior Publication Data

US 2002/0130723 A1 Sep. 19, 2002

(30) Foreign Application Priority Data

Mar. 15, 2001 (JP) ........................................ 2001-074839

(51) Int. Cl.[7] ............................ H03F 3/60; H03F 3/191

(52) U.S. Cl. ......................... 330/286; 330/302; 330/307

(58) Field of Search ................................. 330/277, 286, 330/302, 307; 333/33, 35, 247, 249, 250

(56) References Cited

U.S. PATENT DOCUMENTS 5,872,485 A * 2/1999 Ishikawa et al. ............ 330/286
6,445,255 B1 * 9/2002 Ishikawa et al. ......... 330/286 X

FOREIGN PATENT DOCUMENTS

WO WO97/17738 5/1997
WO WO97/17755 5/1997

* cited by examiner

*Primary Examiner*—Steven J. Mottola
(74) *Attorney, Agent, or Firm*—Dickstein, Shaprio, Morin & Oshinsky, LLP.

(57) ABSTRACT

A radio-frequency amplifier comprises slot lines formed in a top electrode which are bent to define matching segments that are perpendicular to transmitting segments. The matching segments have a length corresponding to one-quarter of the wavelength of a signal to be amplified and are at least partially perpendicular to the transmitting segments. A DC-cut circuit comprising slot lines is connected to the matching segments, an FET is connected to the transmitting segments and the matching segments, and respective matching circuits serve as an input unit and an output unit of the FET. Source terminals of the FET are connected to parts of a top electrode that do not lie between the segments. A drain terminal and a gate terminal are connected, to be electrically separated from each other, to parts of the top electrode, which are electrically separated from the source terminals by the DC-cut circuit, the transmitting segments, and the matching segments.

6 Claims, 7 Drawing Sheets

FIG. 1A
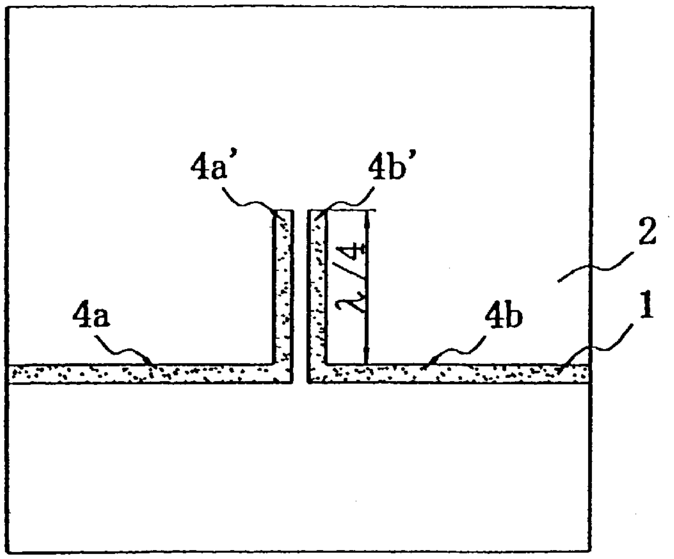
FIG. 1B
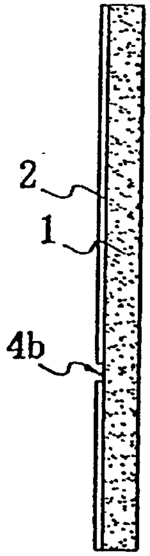
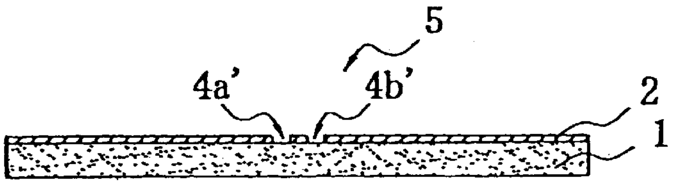
FIG. 1C
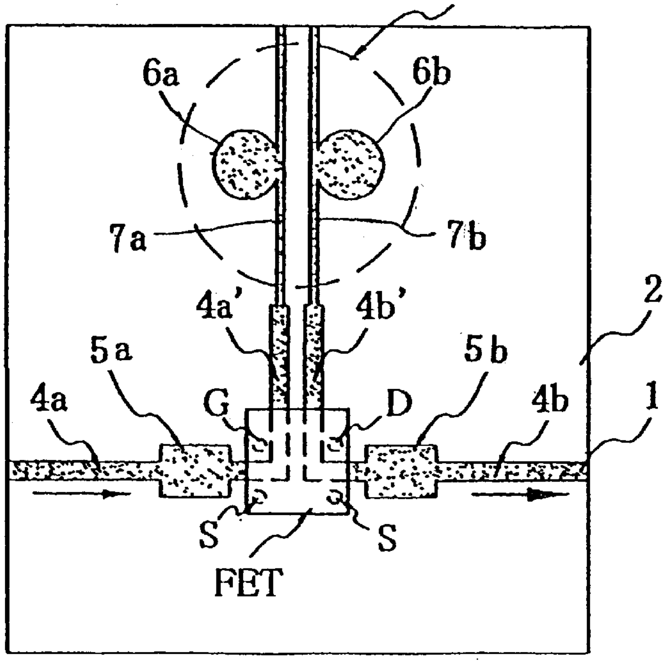
FIG. 2

RADIO-FREQUENCY AMPLIFIER, RADIO-FREQUENCY MODULE AND COMMUNICATION DEVICE

BACKGROUND OF THE INVENTION

1. Field of the Invention

The present invention mainly relates to an amplifier, a radio-frequency module and a communication device for use mainly in a millimeter-wave band, or a microwave band.

2. Description of the Related Art

A related radio-frequency amplifier comprising an active element and a passive element that are mounted on slot lines is disclosed in reference (A), which is PCT Publication No. WO 97/17755. Also of background interest is reference (B), which is PCT Publication No. WO 97/17738.

In the radio-frequency amplifier in reference (A), slot lines formed on a substrate are separated in two, and the separated slot lines are used as an input unit and an output unit. The active element such as a FET is mounted on the substrate. Here, a terminal of the active element is connected to an electrode lying between terminals of the separated input unit and output unit.

The above-described radio-frequency amplifier of the related art has problems to be solved as described below.

In the radio-frequency amplifier in reference (A), the two separated slot lines are used as the input unit and the output unit of the active element, and the terminal of the active element is disposed between the separated input unit and output unit. As a result, the distance between the slots increases to at least the width of the terminal of the amplifier, thereby weakening the linkage between the slots.

For example, when the diameter of a bump of the active element to be mounted is 50 $\mu$m, at least one side of a pad to be formed on the mounting substrate must be 100 $\mu$m. In other words, the slot lines used as the input unit and the output unit must be separated by as much as 100 $\mu$m or more.

FIG. 11 is a graph which shows simulated frequency characteristics of an FET mounting pattern in the radio-frequency amplifier of the related art.

Here, the substrate has a thickness of 0.254 mm and a dielectric constant of 10. The width of the slot is 0.1 mm, and the gap between the separated slots is 0.1 mm (100 m).

As a result, isolation deteriorates over a wide frequency band, as shown in FIG. 11. For example, when desired characteristics are obtained with −20 dB of insertion loss or amount of damping, the isolation band obtained has a width of only about 7 GHz. Accordingly, the number of signals that can be input to the active element decreases, while the signals which directly propagate between the input unit and the output unit increase. Therefore, the gain of the amplifier deteriorates, thereby narrowing the band in which amplifying characteristics are obtained.

SUMMARY OF THE INVENTION

The present invention has been made in view of the problems described above. The present invention provides a radio-frequency amplifier for obtaining sufficient amplifying characteristics over a wide frequency band, the radio-frequency amplifier comprising an input unit and an output unit that are formed as slot lines. The present invention further provides a radio-frequency module that comprises the radio-frequency amplifier, and a communication device that comprises the radio-frequency module.

To these ends, according to an aspect of the invention, a radio-frequency amplifier comprises a circuit substrate, a top electrode formed on the circuit substrate, an input-side slot line and an output-side slot line formed in the top electrode. Each of the input-side slot line and the output-side slot line comprises a transmitting segment and a matching segment. The radio-frequency amplifier also comprises an active element mounted on the top electrode, which comprises terminals. The active element inputs and outputs signals via the transmitting segments and the matching segments. The input-side and output-side slot lines are each bent at a given position to define the corresponding transmitting segment on one side of the given position and the corresponding matching segment, which has a length corresponding to one-quarter of the wavelength of a transmitted signal, on the other side of the given position. Each of the terminals of the active element is connected to a part of the top electrode that does not lie between the matching units. Hence, a low-loss, economical radio-frequency amplifier that operates over a wide frequency band is provided.

Preferably, the radio-frequency amplifier further comprises a DC-cut (DC-Blocking) circuit. The top electrode comprises a first electrode, a second electrode, and a third electrode. The active element is a FET that comprises a source electrode, a gate electrode, and a drain electrode. The source electrode is connected to the first electrode, which separates the slot lines. The gate electrode is connected to the second electrode, which is separated from the first electrode by the DC-cut circuit. The drain electrode is connected to the third electrode, which is separated from the source electrode and the gate electrode by the DC-cut circuit.

A radio-frequency module may comprise the above-described radio-frequency amplifier. Thus, a low-loss and high-efficiency radio-frequency module is provided.

Further, a communication device may comprise the above-described radio-frequency module. Thus, a low-loss and high-efficiency communication device is provided.

Other features and advantages of the present invention will become apparent from the following description of embodiments of the invention which refers to the accompanying drawings.

BRIEF DESCRIPTION OF THE DRAWINGS

FIG. 1A is a plan view of slot lines of a radio-frequency amplifier of a first embodiment of the invention;

FIG. 1B is a side view of the slot lines of the radio-frequency amplifier of the first embodiment;

FIG. 1C is a front sectional view of the slot lines of the radio-frequency amplifier of the first embodiment;

FIG. 2 is a plan view of the radio-frequency amplifier of the first embodiment;

DESCRIPTION OF EMBODIMENTS OF THE INVENTION

Figure 3:
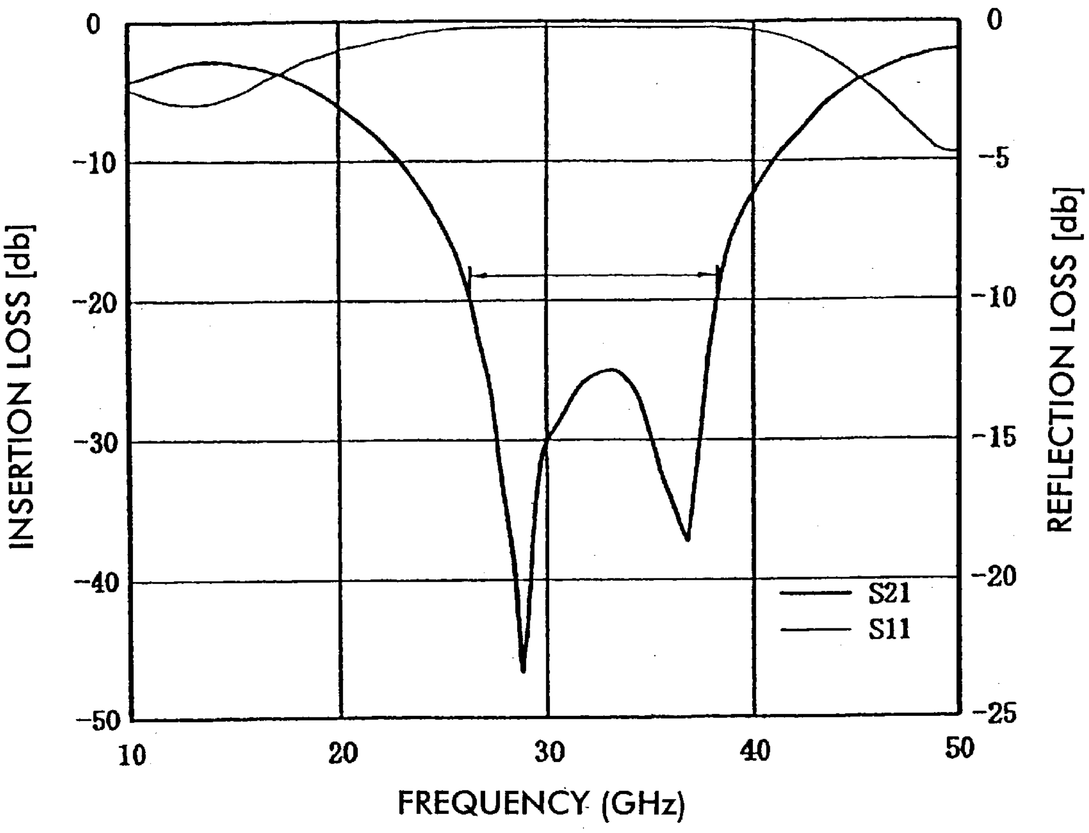
FIG. 3 is a graph showing frequency characteristics of an FET mounting pattern in the radio-frequency amplifier on the basis of a theoretical calculation.

The configuration of a radio-frequency amplifier according to a first embodiment of the invention is described with reference to FIGS. 1A to 1C, 2, 3, and 4.

FIG. 1A is a plan view of slot lines formed on a dielectric substrate, FIG. 1B is a side view of the slot lines, and FIG. 1C is a front sectional view of the slot lines.

FIG. 2 is a plan view of the radio-frequency amplifier.

Referring now to FIGS. 1A, 1B, 1C, and 2, a top electrode 2 is formed on a main surface of a dielectric substrate 1. One of the slot lines 5 is composed of a transmitting segment 4*a* and a matching segment 4*a'*, and the other is composed of a transmitting segment 4*b* and a matching segment 4*b'*. The slot lines 5 are formed on the dielectric substrate 1. Reference character G represents a gate terminal of a FET, reference character D represents a drain terminal of the FET, and reference characters S represent source terminals of the FET. Further, reference character represents the wavelength of a transmitted signal (a signal to be amplified).

The transmitting segments 4*a* and 4*b* and the matching segments 4*a'* and 4*b'* are formed in the top electrode 2 by bending the slots 5 at given positions. The length of the matching segments 4*a'* and 4*b'* corresponds to one-quarter of the wavelength of the transmitted signal. The matching segments 4*a'* and 4*b'* oppose each other and are perpendicular to the transmitting segments 4*a* and 4*b*.

Preferably, the radio-frequency amplifier further comprises a DC-cut (DC-blocking) circuit, shown in FIG. 2. The top electrode comprises a first electrode (the lower electrode as seen in FIG. 2), a second (upper-left) electrode, and a third (upper-right) electrode. The active element is an FET that comprises a source electrode, a gate electrode, and a drain electrode. The source electrode is connected to the first electrode, which separates the slot lines. The gate electrode is connected to the second electrode, which is separated from the first electrode by the DC-cut circuit. The drain electrode is connected to the third electrode, which is separated from the source electrode and the gate electrode by the DC-cut circuit.

As shown in FIG. 2, the DC-cut circuit is connected to the two opposing matching segments 4*a'* and 4*b'* while the FET is connected to the top electrode at the location where the slot lines 5 are bent so as to define the transmitting segments 4*a* and 4*b* and the matching segments 4*a'* and 4*b'*. The resonators 6*a*, 6*b* are sufficiently small and the slots of the DC-cut circuit are sufficiently narrow that they do not substantially affect the electrical length ($\lambda/4$) of the matching segments 4*a'*, 4*b'*. Matching circuits 5*a* and 5*b,* which are enlarged slot-line portions on either side of the FET, work respectively as an input unit and an output unit of the FET.

Here, the DC-cut circuit is defined to include two opposing slots 7*a,* 7*b* which prevent direct current from flowing between the three electrodes. Respective substantially circular resonators 6*a*, 6*b* are connected to the two slots of the DC-cut circuit, for preventing a signal having the frequency of the transmit signal from flowing beyond the DC-cut circuit, for example into a bias circuit (not shown).

The main function of the DC-cut circuit is to divide the electrode on the substrate physically into three parts, so that selected voltages can be applied to the source, the gate, and the drain, respectively, as required for the FET to function properly.

The source terminals S of the FET are connected to the first portion of the top electrode 2, which separates the transmitting segment 4*a* and the matching segment 4*a'* from the transmitting segment 4*b* and the matching segment 4*b'*, respectively. Further, the source terminals S are connected to the top electrode 2 at positions which do not lie between the matching segments 4*a'* and 4*b'*. The gate terminal G and the drain terminal D are connected to the second and third portions of the top electrode 2, respectively, and are electrically separated from the source terminals S by the DC-cut circuit, the transmitting segments 4*a* and 4*b*, and the matching segments 4*a'* and 4*b'*. The drain terminal D and the gate terminal G are electrically separated from each other by the DC-cut circuit.

Accordingly, the radio-frequency amplifier comprises the slot lines 5 having the transmitting segments 4*a* and 4*b* functioning as an input unit and an output unit. By using the slot lines 5, the transmitted signal input to the FET through the transmitting segment 4*a* is amplified by the FET and is output to the exterior through the transmitting segment 4*b*.

Here, the length of the matching segments 4*a'* and 4*b'* corresponds to about one-quarter of the wavelength of the transmitted signal, so that the signal is efficiently transmitted from the transmitting segment 4*a* to the FET.

FIG. 3 is a graph which shows simulated frequency characteristics of the FET amplifier shown in FIG. 2, wherein the substrate is 0.254 mm in thickness, the dielectric constant is 10, the width of the slot lines is 0.1 mm, and the gap between the separated matching segments is 0.04 mm (40 m).

Figure 4:
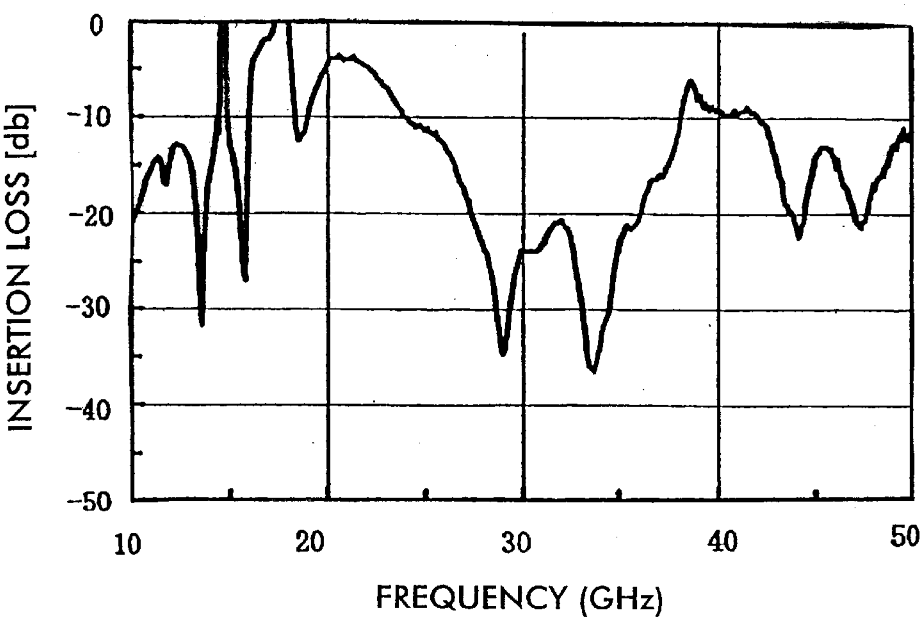
FIG. 4 is a graph showing frequency characteristics of the FET mounting pattern in the radio-frequency amplifier, which is the result obtained by measuring the FET mounting pattern.

FIG. 4 shows actual frequency characteristics which are obtained by measuring the above-described FET mounting pattern.

By using the above-described slot lines 5, isolation characteristics improve as shown in FIGS. 3 and 4. Accordingly, when desired damping characteristics are obtained at −20 dB, the width of the isolation band becomes about 12 GHz, which is broader than when the amplifier of the related art is used.

In accordance with the above-described configuration, the two slot lines are firmly coupled. Thus, the insertion loss increases when a resonant frequency is near an even mode and an odd mode and the reflection between the two slot lines increases, whereby remarkable isolation characteristics are obtained over a wide frequency band. As a result, a signal transmitted through the transmitting segment 4*a* is efficiently input to the FET, and the signal input to the FET and a signal output from the FET do not combine. Thus, the gain of the amplifier increases over a wide frequency band.

The similar result can be obtained by using an active element other than the FET. However, electrical characteristics in a radio-frequency band obtained by the FET are superior to those obtained by other active elements.

The segments provided on the dielectric substrate are not necessarily formed as shown in FIG. 1. Each of the matching segments 4*a'* and 4*b'* may be further bent at any position, and may be provided with a circular or fan-shaped stub at the free end thereof, as shown in FIGS. 5A to 5C and 6A and 6B.

Also, for an FET in which two source terminals S are diagonally arranged and a gate terminal G and a drain terminal D are diagonally arranged on the bottom face thereof, radio-frequency amplifiers using slot lines shown in FIGS. 7A to 7C and 8A and 8B have the same effects as those of the above-described radio-frequency amplifier.

FIGS. 5A to 5C, 6A and 6B, 7A to 7C, and 8A and 8B are plan views of other radio-frequency amplifiers.

In FIGS. 5A to 5C, 6A and 6B, 7A to 7C, and 8A and 8B, reference numeral 1 represents a dielectric substrate, reference numeral 2 represents a top electrode, reference numerals 4*a* and 4*b* represent transmitting segments, reference numerals 4*a'* and 4*b'* represent matching segments, reference numerals 7*a* and 7*b* represent the slot lines of the DC-cut circuit, and reference numerals 6*a* and 6*b* represent fan-shaped or circular stubs. Further, reference character G represents a gate terminal of an FET, reference character D represents a drain terminal of the FET, and reference characters S represent source terminals of the FET.

Figure 5A:
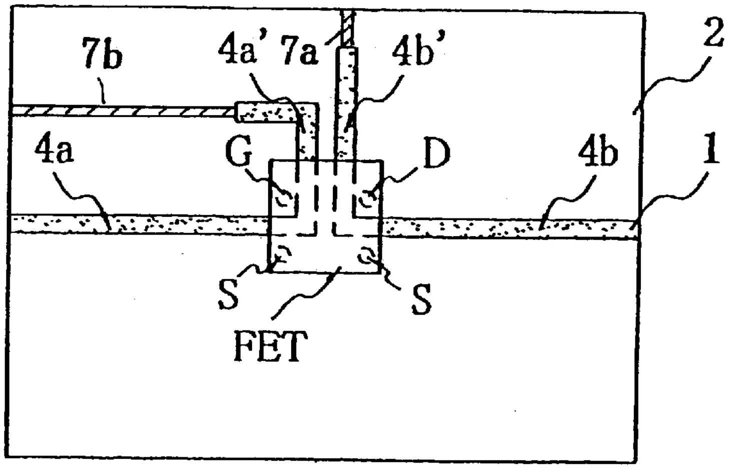
FIG. 5A is a plan view of an exemplary radio-frequency amplifier of a second configuration.
Figure 5B:
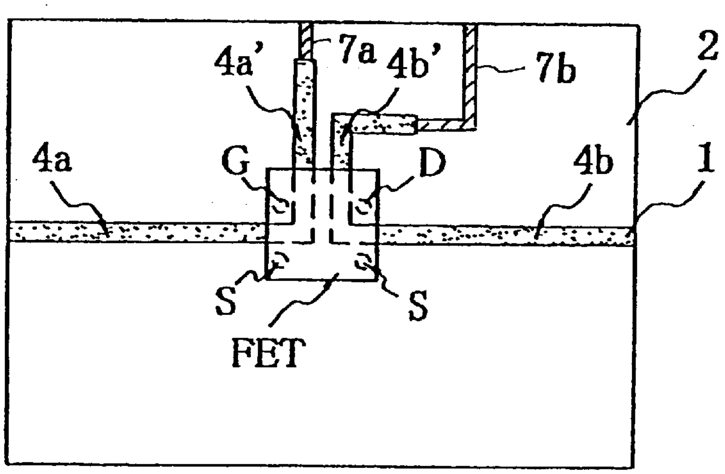
FIG. 5B is a plan view of an exemplary radio-frequency amplifier of a third configuration.
Figure 5C:
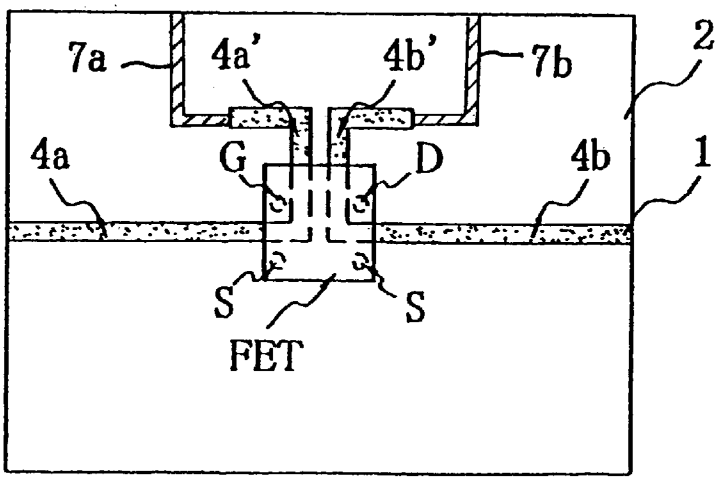
FIG. 5C is a plan view of an exemplary radio-frequency amplifier of a fourth configuration.

FIGS. 5A and 5B show slot lines comprising the two opposing matching segments 4*a'* and 4*b'*. In both cases, one of the matching segments 4*a'* and 4*b'* is bent so that the bent part becomes parallel with the transmitting segments 4*a* and 4*b*. FIG. 5C shows slot lines comprising the two opposing matching segments 4*a'* and 4*b'*. Both the matching segments 4*a'* and 4*b'* are bent so that the bent parts become parallel with the transmitting segments 4*a* and 4*b*.

Figure 6A:
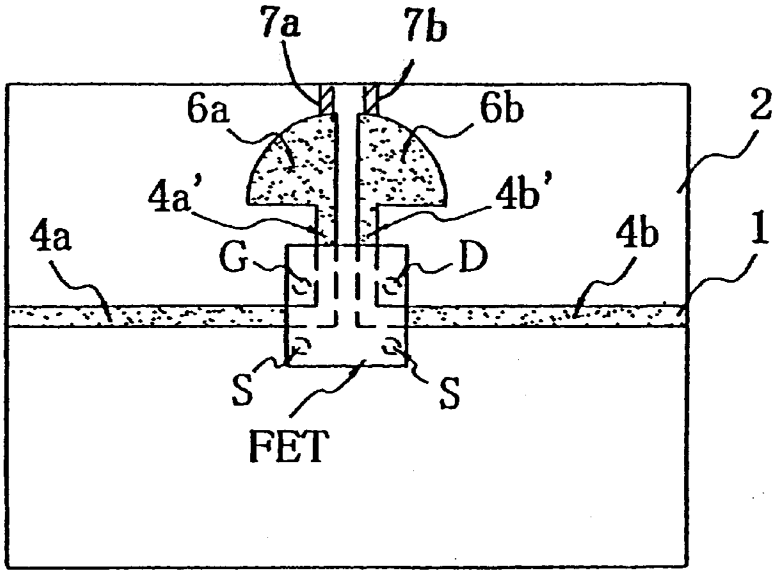
FIG. 6A is a plan view of an exemplary radio-frequency amplifier of a fifth configuration.
Figure 6B:
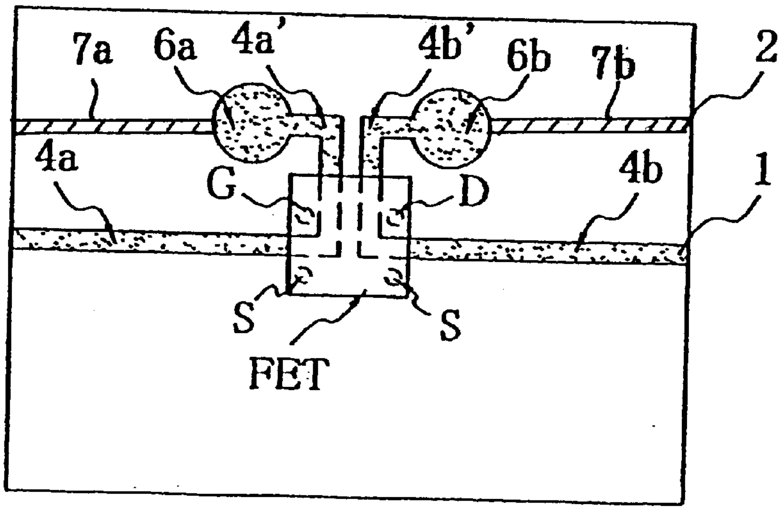
FIG. 6B is a plan view of an exemplary radio-frequency amplifier of a sixth configuration.

FIG. 6A shows slot lines comprising the matching segments 4*a'* and 4*b'*. Fan-shaped stubs 6*a* and 6*b* are provided at free ends of the matching segments 4*a'* and 4*b'*, respectively. FIG. 6B shows slot lines comprising the matching segments 4*a'* and 4*b'*. Circular stubs 6*a* and 6*b* are provided at free ends of the matching segments 4*a'* and 4*b'*, respectively.

Figure 7A:
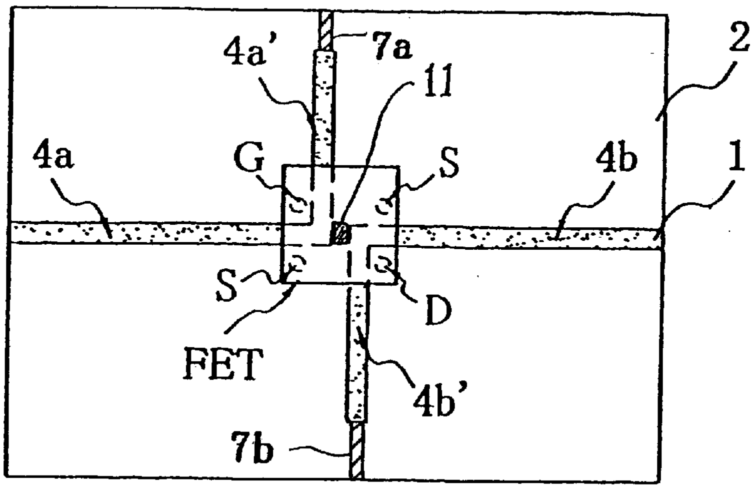
FIG. 7A is a plan view of an exemplary radio-frequency amplifier of a seventh configuration.

FIG. 7A shows slot lines wherein the transmitting segment 4*b* and the matching segment 4*b'* shown in FIG. 1 are formed so as to be rotated 180° with respect to the transmitting segment 4*a* and the matching segment 4*a'*, respectively. The lengths of the matching segments 4*a'* and 4*b'* correspond to one-quarter of the wavelength of the transmitted signal.

Figure 7B:
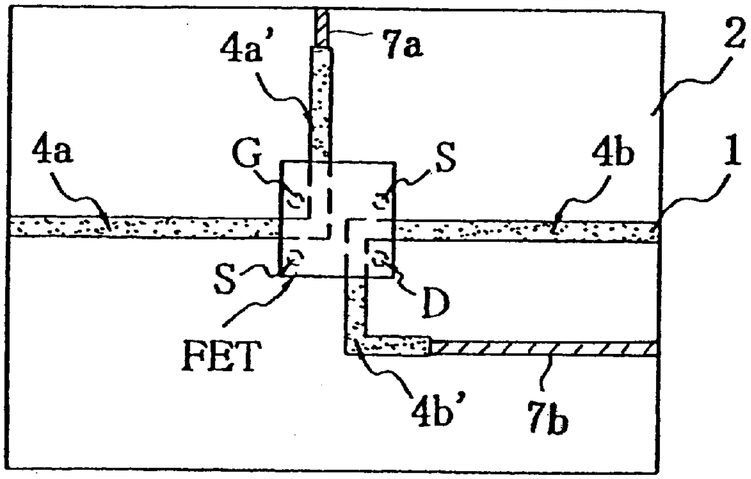
FIG. 7B is a plan view of an exemplary radio-frequency amplifier of an eighth configuration.
Figure 7C:
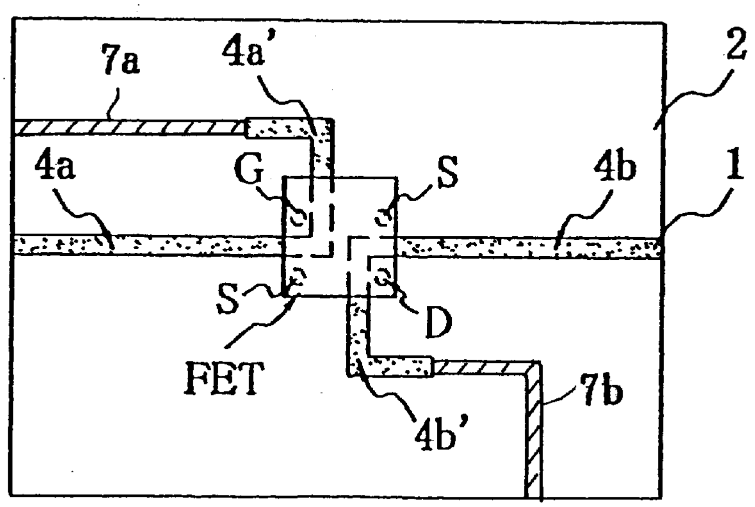
FIG. 7C is a plan view of an exemplary radio-frequency amplifier of a ninth configuration.

FIGS. 7B and 7C show slot lines comprising the matching segments 4*a'* and 4*b'*. In FIG. 7B, unlike FIG. 7A, one of the matching segments 4*a'* and 4*b'* is bent so that the bent part becomes parallel with the transmitting segments 4*a* and 4*b*. In FIG. 7B, matching segment 4*b'* is bent; however, matching segment 4*a'* could be bent instead. In FIG. 7C, both the matching segments 4*a'* and 4*b'* are bent so that the bent parts become parallel with the transmitting segments 4*a* and 4*b*.

Figure 8A:
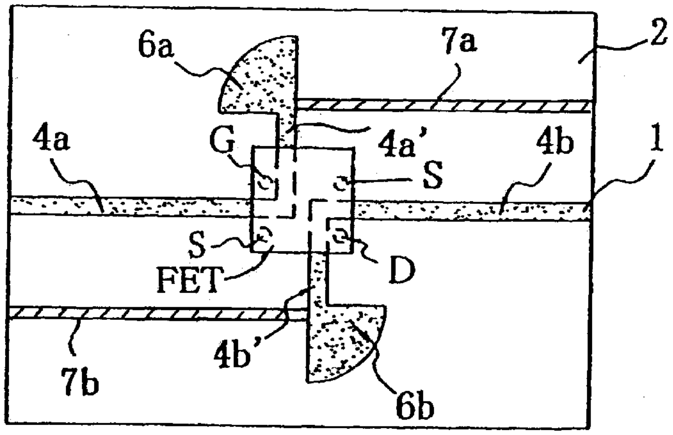
FIG. 8A is a plan view of an exemplary radio-frequency amplifier of a tenth configuration.
Figure 8B:
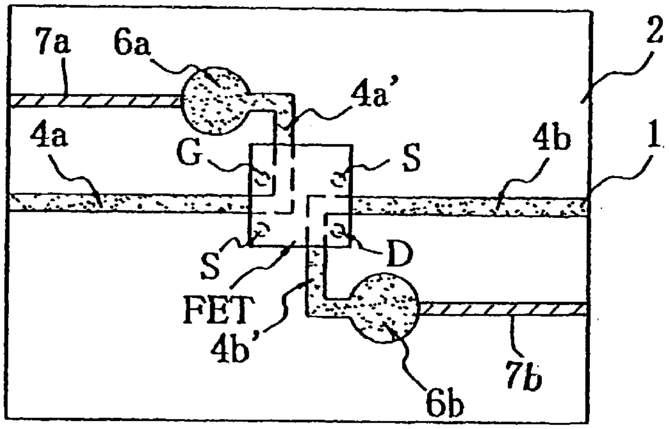
FIG. 8B is a plan view of an exemplary radio-frequency amplifier of an eleventh configuration.

FIG. 8A shows slot lines comprising the matching segments 4*a'* and 4*b'*. Fan-shaped stubs 6*a* and 6*b* are provided at free ends of the matching segments 4*a'* and 4*b'*, respectively. FIG. 8B shows slot lines comprising matching segments 4*a'* and 4*b'* as shown in FIGS. 7A to 7C. Circular stubs 6*a* and 6*b* are provided at free ends of the matching segments 4*a'* and 4*b'*, respectively.

Further, in the radio-frequency amplifier shown in FIGS. 7A to 7C, and 8A and 8B, there is an area lying between the transmitting segments 4*a* and 4*b* where they are mutually opposing. Specifically, an area represented by reference numeral 11 in FIG. 7A will be referred to as "an area lying between the two slot lines" in the present invention. This definition can be applied to the cases shown in FIGS. 7B and 7C, and 8A and 8B.

The respective shapes of the DC-cut circuits shown in FIGS. 2 and 5A–8B, are merely non-limiting examples, and can be freely changed as desired.

Figure 9:
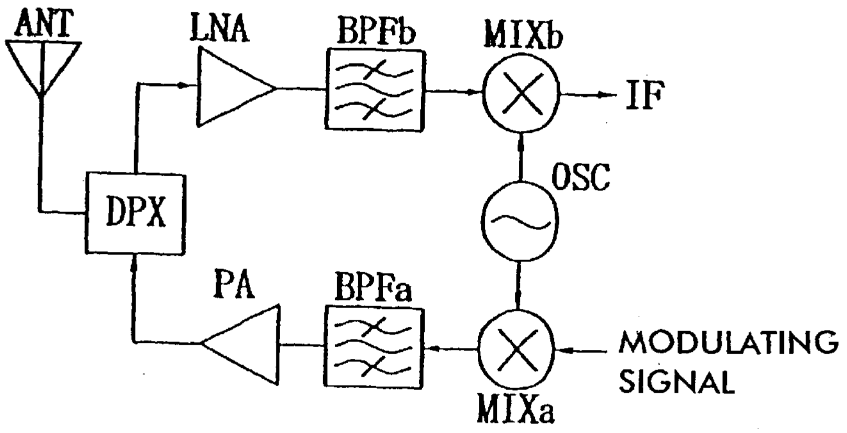
FIG. 9 is a block diagram of a radio-frequency module according to a second embodiment of the invention.

Referring now to FIG. 9, the configuration of a radio-frequency module according to a second embodiment is described.

The radio-frequency module includes a transmit/receive antenna ANT, a duplexer DPX, bandpass filters BPFa and BPFb, a power amplifier PA, a low-noise amplifier LNA, mixers MIXa and MIXb, an oscillator OSC, and an intermediate-frequency signal IF.

The mixer MIXa is provided for mixing a modulating signal with a signal output from the oscillator OSC, and the bandpass filter BPFa is provided for transmitting a signal within a transmit frequency band among the signals that are mixed and output from the mixer MIXa. The power amplifier PA is provided for power-amplifying the transmitted signals and for transmitting the amplified signals via the duplexer DPX. The low-noise amplifier LNA is provided for amplifying signals received from the duplexer DPX. The bandpass filter BPFb receives the amplified signals output from the low-noise amplifier LNA, and transmits a signal within a receive frequency band among the received signals. The mixer MIXb mixes the signal transmitted from the bandpass filter BPFb with a frequency signal output from the oscillator OSC, and outputs an intermediate-frequency signal IF.

The radio-frequency amplifier shown in FIG. 1 and FIGS. 5A to 5C, 6A and 6B, 7A to 7C, and 8A and 8B may be used as the amplifiers PA and LNA shown in FIG. 9. Thus, by using the disclosed broadband radio-frequency amplifier with good amplifying characteristics, the radio-frequency module is provided with good communication characteristics and reduced loss.

Figure 10:
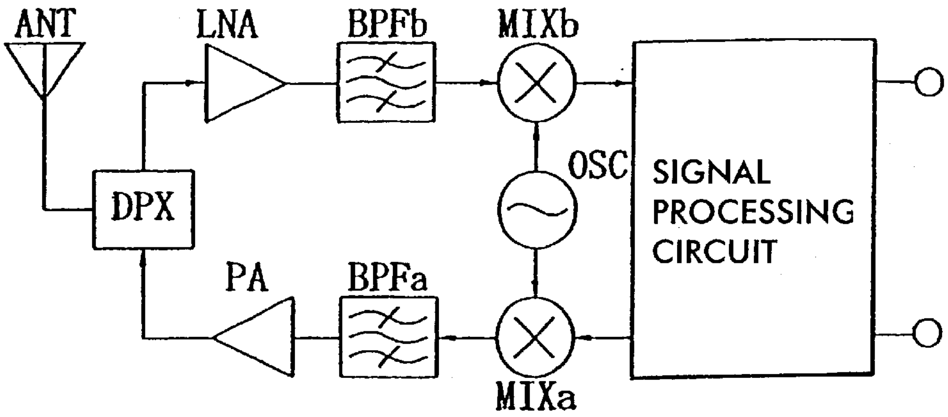
FIG. 10 is a block diagram of a communication device according to an third embodiment of the invention.
Figure 11:
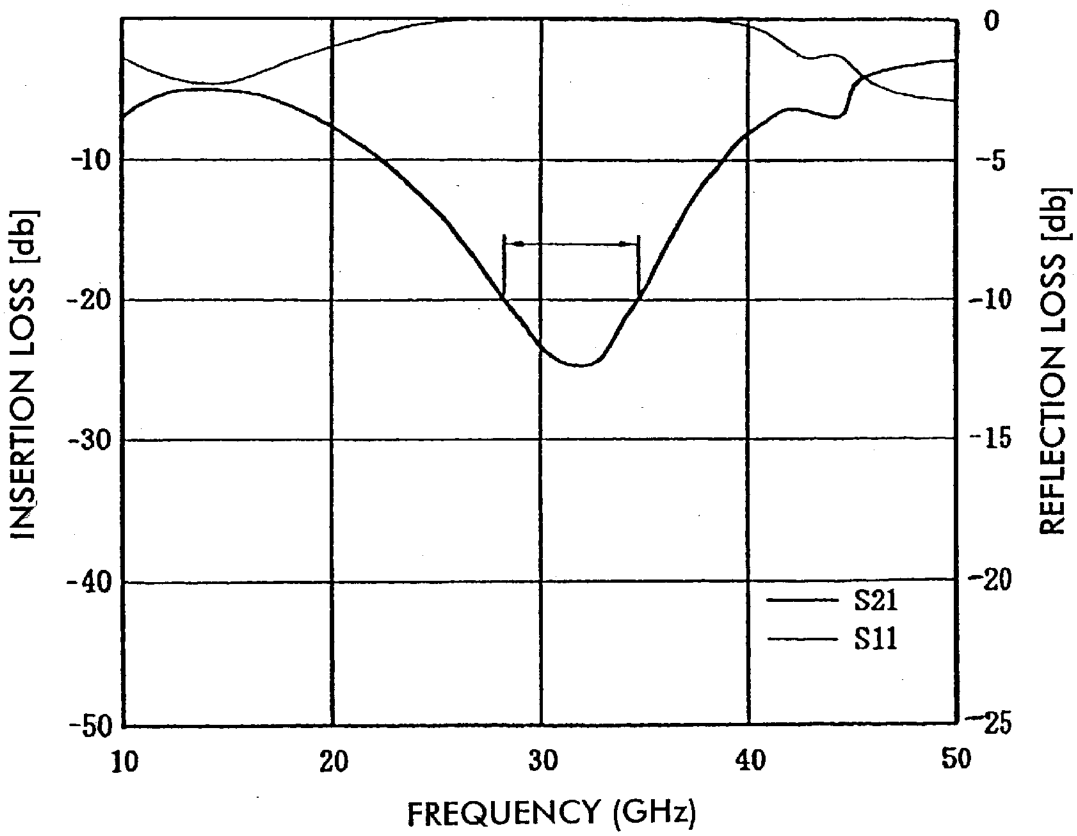
FIG. 11 PRIOR ART
FIG. 11 is a graph showing simulative frequency characteristics of an FET mounting pattern in a radio-frequency amplifier of the related art.

Referring now to FIG. 10, the configuration of a communication device according to a third embodiment is explained.

FIG. 10 is a block diagram showing how the communication device is configured. The communication device comprises the radio-frequency module shown in FIG. 9 and a known signal processing circuit shown in FIG. 10. The signal processing circuit comprises an encoding and decoding circuit, a synchronous control circuit, a modulator, a demodulator, a CPU and so forth. The communication device further comprises a circuit for inputting and outputting a transmit/receive signal to and from the signal processing circuit.

Thus, the communication device using the radio-frequency module according to the present invention exhibits its good communication characteristics and reduced loss.

Although the present invention has been described in relation to particular embodiments thereof, many other variations and modifications and other uses will become apparent to those skilled in the art. Therefore, the present invention is not limited by the specific disclosure herein.

What is claimed is:

1. A radio-frequency amplifier comprising:

a circuit substrate;

a top electrode formed on the circuit substrate;

an input-side slot line and an output-side slot line formed in the top electrode, each comprising a transmitting segment and a matching segment; and an active element mounted on the top electrode, which comprises terminals, wherein the active element is arranged for inputting and outputting signals via the transmitting segments and the matching segments, and wherein each of the input-side and output-side slot lines is bent at a given position to define the corresponding transmitting segment on one side of the given position and to define the matching segment on the other side of the given position, wherein each of the matching segments has a length corresponding to one-quarter of the wavelength of a signal to be amplified, and wherein each of the terminals of the active element is connected to a part of the top electrode that does not lie between the matching segments.

2. A radio-frequency module comprising a radio-frequency amplifier as claimed in claim 1.

3. A communication device comprising a radio-frequency module as claimed in claim 2.

4. A radio-frequency amplifier according to claim 1, further comprising a DC-cut circuit, wherein the top electrode comprises:

a first electrode, which separates the slot lines;

a second electrode, which is separated from the first electrode by the DC-cut circuit; and a third electrode, which is separated from the source electrode and the gate electrode by the DC-cut circuit;

and the active element is an FET, the FET comprising:

a source electrode;

a gate electrode; and a drain electrode, wherein the source electrode is connected to the first electrode, the gate electrode is connected to the second electrode, and the drain electrode is connected to the third electrode.

5. A radio-frequency module comprising a radio-frequency amplifier as claimed in claim 4.

6. A communication device comprising a radio-frequency module as claimed in claim 5.

* * * * *